United States Patent
Krywanczyk et al.

(10) Patent No.: US 7,902,682 B2
(45) Date of Patent: Mar. 8, 2011

(54) ULTRAVIOLET ENERGY CURABLE TAPE AND METHOD OF MAKING A SEMICONDUCTOR CHIP USING THE TAPE

(75) Inventors: Timothy C. Krywanczyk, Essex Junction, VT (US); Donald W. Brouillette, St. Albans, VT (US); Steven A. Martel, Swanton, VT (US); Matthew R. Whalen, Chelsea, VT (US)

(73) Assignee: International Business Machines Corporation, Armonk, NY (US)

( * ) Notice: Subject to any disclaimer, the term of this patent is extended or adjusted under 35 U.S.C. 154(b) by 1459 days.

(21) Appl. No.: 10/715,689

(22) Filed: Nov. 18, 2003

(65) Prior Publication Data

US 2005/0104147 A1 May 19, 2005

(51) Int. Cl.
*H01L 23/48* (2006.01)
(52) U.S. Cl. ..... 257/783; 257/753; 257/782; 257/E23.16
(58) Field of Classification Search .................. 427/54.1; 522/4; 428/355 AC, 332, 442, 514; 359/586; 257/753, 782, 783
See application file for complete search history.

(56) References Cited

U.S. PATENT DOCUMENTS

| | | | | |
|---|---|---|---|---|
| 4,651,011 | A | | 3/1987 | Ors et al. .................. 250/459.1 |
| 5,047,444 | A | | 9/1991 | DeVoe et al. .................. 522/99 |
| 5,556,663 | A | | 9/1996 | Chang et al. .................. 427/8 |
| 5,712,485 | A | | 1/1998 | Broer et al. ................. 250/474.1 |
| 6,339,111 | B1 | * | 1/2002 | Moon et al. ........................ 522/4 |
| 6,436,532 | B1 | * | 8/2002 | Moon et al. ............. 428/355 AC |
| 2002/0076549 | A1 | * | 6/2002 | Welch et al. .................. 428/332 |

FOREIGN PATENT DOCUMENTS

| | | |
|---|---|---|
| JP | 9-075838 | 7/1996 |
| WO | WO 92/15651 * | 9/1992 |

* cited by examiner

*Primary Examiner* — Wai-Sing Louie

(74) *Attorney, Agent, or Firm* — Scully, Scott, Murphy & Presser, P.C.; Joseph Petrokaitis, Esq.

(57) ABSTRACT

There is provided a UV energy curable tape comprising an adhesive material including a UV energy curable oligomer, a UV energy initiator, and a material which emits optical light when the tape composition is substantially fully cured. A semiconductor chip made using the tape is also provided.

22 Claims, No Drawings

ULTRAVIOLET ENERGY CURABLE TAPE AND METHOD OF MAKING A SEMICONDUCTOR CHIP USING THE TAPE

FIELD OF THE INVENTION

This invention relates to an ultraviolet (UV) energy curable tape and more particularly to a UV energy curable tape that emits optical light when the tape is substantially fully cured. The invention further relates to a method of making a semiconductor chip using the tape.

BACKGROUND OF THE INVENTION

In the fabrication process of semiconductor devices such as a semiconductor integrated circuit on a semiconductor wafer, it is commonly practiced to divide the semiconductor wafer into individual chips by a dicing process.

Before applying such a dicing process, it is generally necessary to grind a surface of the wafer opposite a first surface on which the semiconductor devices are formed, such that the wafer has a predetermined thickness. For example, such a grinding process can be used to reduce the thickness of a wafer to 500 microns ($\mu$) or less according to the specification of the semiconductor device.

In order to prevent damaging of the semiconductor wafer from, for example, cracking at the time of grinding, it is commonly practiced to protect the devices on the first surface, commonly referred to as the front side, of the wafer by an adhesive medium such as an adhesive tape. Generally, the adhesive tape used for such a purpose carries, on a tape support layer, a layer of adhesive material including acrylic resin with a thickness of about 30-40$\mu$. The tape support layer, in turn, is formed of a polymer such as a polyolefin, polyvinyl, or polyethylene and generally has a thickness of about 100-150$\mu$.

After the grinding process, the semiconductor wafer is diced into individual chips followed by removal of the adhesive tape. In order to help facilitate removal of the tape and adhesive, the adhesive layer used for such a purpose is generally added with a surfactant. By doing so, any adhesives remaining on the diced wafer surface or surfaces of the chips after tape removal can be more easily removed by cleaning with purified water or an organic solvent. It should be noted that the composition of adhesives used in such a tape changes substantially lot by lot, and the adhesive of the tape tends to establish very intimate adhesion with the wafer surface. Adhesive residues often remain, such as amorphous carbon, nitrides or amorphous polyimides, and extensive cleaning may be required. Such a strong adhesion suggests that there is a crosslink reaction between the adhesive and the residual materials on the wafer. Sometimes up to 60 minutes or more of cleaning time may be required. As the front side surface of the wafer generally includes a thin film, such as a polyimide or SiN, any tape adhesive remaining on the front side of the diced wafer surface or surfaces of the chips after tape removal, raises serious performance problems.

Attempts have been made to use an adhesive tape that carries a UV energy curable type adhesive on the tape base for the purpose of the protection of the wafer during the grinding process. When using such a UV energy curable type tape, an ultraviolet radiation is applied to the diced wafer covered by the tape, before removing (picking) the individual chips of the diced wafer from the tape, facilitating the removal of the tape. As the adhesive is cured by the ultraviolet radiation, the adhesion of the tape to the diced wafer is reduced substantially and removal of the individual chips from the tape is achieved more easily. If the UV energy curable type tape is not substantially fully cured because of insufficient UV energy delivered to the tape, adhesive residues can still remain on the chips originating from the diced wafer surface from which the tape was removed. One cause of insufficient UV energy delivery can be debris on the exposed tape surface blocking a portion of UV energy intended to be delivered to the tape. When UV light is used as the vehicle to deliver UV radiation to the tape, lamp or bulb problems can lead to insufficient UV energy being delivered to the tape. As a result, use of the UV energy curable tape has not been made a matter of common practice for fabricating semiconductor devices.

It is possible to eliminate the cleaning process by applying an ozone ashing process for a limited time interval against the front side surface of the diced chips after removal of the tape, such that any remaining organic materials are oxidized. However, such an ozone ashing process requires a huge facility investment and the cost of the semiconductor is therefore increased. It is also possible to apply an additional post treatment process by using an organic solvent, such as isopropyl alcohol, for removing any remaining adhesive residues. Such a post treatment inevitably lowers the production throughput of the semiconductor chips.

A UV energy curable tape that could be used to optically monitor the tape cure level and that could be used to optically determine when the tape was substantially fully cured and more easily removed from the diced wafer would be a substantial advance in semiconductor chip manufacturing technology.

OBJECTS AND SUMMARY OF THE INVENTION

Accordingly it is the object of this invention to enhance the art of packaging technology.

It is another object of this invention to provide a UV energy curable tape that emits optical light when the tape is substantially fully cured.

It is yet another object of this invention to provide a method of making a semiconductor chip wherein a UV energy curable tape is utilized.

It is still yet another object of this invention to provide a semiconductor chip that will be manufactured using a UV energy curable tape in its manufacturing process having relatively lower manufacturing costs than many current products.

According to one aspect of the invention there is provided a UV energy curable tape comprising a support layer, an adhesive material including a UV energy curable oligomer, a UV energy initiator, and a material which emits optical light when the tape is substantially fully cured positioned on the support layer.

According to another aspect of the invention there is provided a UV energy curable tape comprising a support layer including a material which emits optical light when the tape is substantially fully cured, and an adhesive material positioned on the support layer having a UV energy curable oligomer and a UV energy initiator as part thereof.

According to yet another aspect of the invention there is provided a method of making a semiconductor chip comprising the steps of providing a semiconductor wafer substrate having a first surface, forming a layer of UV energy curable tape on the first surface, the tape including a material which emits optical light when substantially fully cured, and applying UV energy to the layer of UV energy curable tape until the material emits optical light.

According to still yet another method of making a semiconductor chip there is provided another method of making a semiconductor chip comprising the steps of providing a layer of UV energy curable tape on a support layer, the support layer including a material which emits optical light when the tape is substantially fully cured, placing the UV energy curable tape on a surface of a semiconductor wafer, and applying UV light on and through the support layer until the support layer emits optical light.

BEST MODE FOR CARRYING OUT THE INVENTION

In accordance with the teachings of this invention, there is provided a new adhesive tape for use in the manufacture of a semiconductor chip. In one embodiment, the tape comprises an adhesive material including a UV energy curable oligomer, a UV energy initiator, and a material which emits optical light when the tape is substantially fully cured. It has been discovered that when this tape is utilized in the manufacture of a semiconductor chip, in accordance with the present invention, wafers will not be detaped or chips will not be picked from a diced wafer until the tape has been substantially fully cured. Chips and the C4 connections on the taped side of the wafer/chips will not be damaged during the picking process due to high adhesion of substantially uncured tape with the taped surface. Furthermore, residual adhesive on the detaped surface will be substantially reduced and costly cleaning processes will be eliminated, thus reducing manufacturing costs. The chip will have fewer defects and there will be a resultant higher manufacturing yield, also reducing manufacturing costs. Chip reliability will be improved. In another embodiment of the present invention, there is provided a UV energy curable tape comprising a support layer including a material which emits optical light when the tape is substantially fully cured, and an adhesive material positioned on the support layer having a UV energy curable oligomer and a UV energy initiator as part thereof. Since the optically light emitting material is contained within the support layer, this embodiment, in addition to the benefits described above, will allow use of optically light emitted materials which may be incompatible with the adhesive. The support layer can be comprised of a polyolefin, polyvinyl, or polyethylene material.

The adhesive material of this invention comprises an acrylate oligomer. The UV energy curable acrylate oligomer comprises a material capable of reacting with radicals to form longer chain polymers. One example of an acrylate oligomer that can be used in this invention is $CH_2=CH-COOR$ where R is a monomer of high molecular weight. The adhesive material of the composition is included in a commercially available tape. Examples of commercially available tapes that can be used in this invention are SP-57B-150, SP-510B-140, SP-552M-130, and SP541B-205, all available from Furukawa Electric Company, 900 Lafayette Street, Suite 506, Santa Clara, Calif. 95050. The adhesive is important to the composition because it flows onto the surface of the wafer substrate to be taped during the tape apply process and creates a seal with the substrate surface to be taped. This seal is important because it inhibits process chemicals and wafer particles from contacting (and possibly damaging) the circuitry and C4 connections on the chip surface during the grinding, polishing and dicing steps of the semiconductor chip manufacturing process.

The UV energy initiator comprises a photoinitiator. The UV energy initiator of the tape is included as part of the adhesive of a commercially available tape as described above. An example of a UV energy initiator that can be used in this invention is a diphenyl photoinitiator. A diphenyl photoinitiator has the chemical formula of:

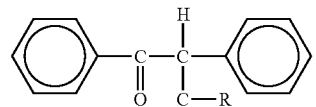

When exposed to UV energy, for example, in the form of UV light, the diphenyl photoinitiator decomposes to one of two free radicals with the chemical formulas:

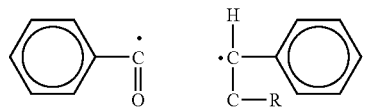

These free radicals can react with the acrylate oligomer breaking the double bond to yield another free radical as follows:

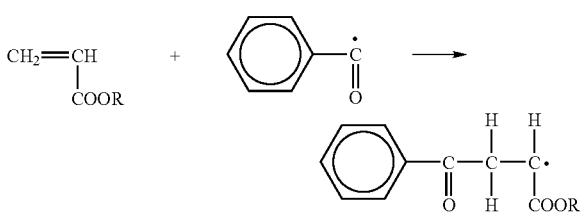

This free radical can continue to react or crosslink with other acrylate molecules present to form long chain polymers as follows:

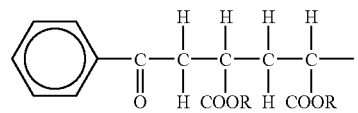

This process is called curing. The curing process depends primarily on the amount of UV energy absorbed and the amounts of photoinitiator and acrylate oligomer available for reaction.

The material which emits optical light when the tape is substantially fully cured can be added to the adhesive of a commercially available tape, as described above. The material can also be added to the support layer of a commercially available tape. The material can be a UV sensitive ink. The UV sensitive ink comprises from about 0.001% to about 20% by weight of the tape. One example of a commercially available UV sensitive ink that can be used in this invention is Photosol, available from PPG, one PPG Place, Pittsburgh, Pa., 15272. Another example of a material which emits optical light when the tape composition is substantially fully cured is a UV dye. Examples of a commercially available UV dyes that can be used in this invention are the MSA family of dyes, available from H.W. Sands Corp., 1080 E. Indiantown Road, Suite, Jupiter, Fla., 33477. If UV sensitive ink or dye are used as the material for this invention, the light emitting energy range is designed to match the amount of energy required to substantially fully cure the tape so it can release from the substrate. Therefore when the tape is substantially fully cured the UV sensitive ink or dye will emit light. In this invention the ink or dye will change color to indicate when the tape is substantially fully cured. The light emission can be sensed optically or by a machine capable of sensing optical light changes. The composition can be defined as substantially fully cured when it has absorbed from about 5 millijoules/cm$^2$ to about 10 joules/cm$^2$ of UV energy into the tape. If too little energy is used the tape will not be cured. If too much energy is used the tape can breakdown due to excessive heat. When this occurs there will be residual adhesive left on the C4 bumps after removal of the tape or the chips can crack during picking due to high tack levels. This will be manifest at chip inspection. The UV energy source used in this invention is preferably UV light supplied by a bulb as part of a UV lamp.

In accordance with yet another embodiment of this invention, a method of making a semiconductor chip using the above defined tape is hereby provided. The method comprises the steps of providing a semiconductor wafer substrate having a first surface, forming a layer of a UV energy curable tape on the first surface, the tape including a material which emits optical light when substantially fully cured, and applying UV energy to the layer of UV energy curable tape until the material emits optical light. The function of the adhesive tape is to protect and support the semiconductor wafer. The method of making the semiconductor chip further includes the step of dicing the semiconductor wafer into at least two semiconductor chips after the step of forming the layer of UV energy curable tape. Next the UV energy curable tape is then substantially fully cured, as previously described, by shining UV light on the layer of UV energy curable tape in the amount of from about 5 millijoules/cm$^2$ to about 10 joules/cm$^2$. The semiconductor chips can then be removed from the substantially fully cured tape with a minimal amount of tape residue being left on the semiconductor chips.

In accordance with still yet another embodiment of this invention, another method of making a semiconductor chip using the above defined tape is hereby provided. The method comprises the steps of providing a layer of UV energy curable tape on a support layer, the support layer including a material which emits optical light when the tape is substantially cured, placing the UV energy curable tape on a surface of a semiconductor wafer, and applying UV light on and through the support layer until the support layer emits optical light. One advantage of having the UV sensitive material as part of the support layer is that the UV sensitive material does not come in contact with the wafer substrate surface when the tape is applied, only the adhesive contacts this surface. The method further includes the steps, as previously described, of dicing the semiconductor wafer into at least two semiconductor chips after the step of forming the layer of UV energy curable tape, substantially fully curing the tape, and removing the semiconductor chips from the substantially fully cured tape with a minimal amount of tape residue being left on the semiconductor chips.

While there have been described what are the presently considered preferred embodiments of the invention, it will be obvious to those skilled in the art that various changes and modifications may be made therein without departing from the scope of the invention as defined by the appended claims.

We claim:

1. A UV energy curable tape comprising:
  a support layer;
  an adhesive material positioned on said support layer, and including a UV energy curable oligomer, a UV energy initiator, and a material which starts to emit optical light of a first type when said tape becomes substantially fully cured.

2. The UV energy curable tape of claim 1, wherein said adhesive material comprises an acrylate oligomer.

3. The UV energy curable tape of claim 1, wherein said UV energy curable oligomer comprises a material capable of reacting with radicals to form longer chain polymers.

4. The UV energy curable tape of claim 1, wherein said UV energy initiator comprises a photoinitiator.

5. The UV energy curable tape of claim 4, wherein said photoinitiator includes diphenyl groups that create radicals when exposed to UV energy.

6. The UV energy curable tape of claim 1, wherein said material which emits optical light comprises UV sensitive ink.

7. The UV energy curable tape of claim 6, wherein said material which emits optical light comprises from about 0.001 weight percent to about 20 weight percent of said tape.

8. The UV energy curable tape of claim 1, wherein said material which emits optical light comprises UV sensitive dye.

9. The UV energy curable tape of claim 1, wherein substantially fully cured comprises the absorption of about 5 millijoules/cm$^2$ to about 10 joules/cm$^2$ of UV energy into said tape.

10. A UV energy curable tape comprising:
  a support layer including a material which starts to emit optical light of a first type when said tape becomes substantially fully cured; and
  an adhesive material positioned on said support layer and having a UV energy curable oligomer and a UV energy initiator as part thereof.

11. The UV energy curable tape of claim 10, wherein said adhesive material comprises an acrylate oligomer.

12. The UV energy curable tape of claim 10, wherein said UV energy initiator comprises a photoinitiator.

13. The UV energy curable tape of claim 10, wherein said material which emits optical light comprises UV sensitive ink.

14. The UV energy curable tape of claim 13, wherein said material which emits optical light comprises from about 0.001 weight percent to about 20 weight percent of said tape.

15. The UV energy curable tape of claim 10, wherein said material which emits optical light comprises UV sensitive dye.

16. The UV energy curable tape of claim 10, wherein substantially fully cured comprises the absorption of about 5 millijoules/cm$^2$ to about 10 joules/cm$^2$ of UV energy into said tape.

17. The UV energy curable tape of claim 1, wherein the light emitting material emits light of a second type, different from said first type, as the tape is being cured, and the type of light emitted by said light emitting material changes from said second type to said first type when the tape becomes substantially fully cured.

18. The UV energy curable tape of claim 1, for use with a given substrate, and wherein the amount of energy needed to cause the light emitting material to emit the first type of light matches the amount of energy required to substantially fully cure the tape, thereby to facilitate completely removing the tape from the given substrate.

19. The UV energy curable tape of claim 1, wherein:
  the material which starts to emit optical light is a UV sensitive material; and the light emitting energy range of the light emitting material matches the amount of UV energy required to substantially fully cure the tape.

20. The UV energy curable tape of claim 1, wherein
said material which emits optical light comprises about 0.001% by weight of the tape;
said material which emits optical light starts to emit optical light of the first type when said tape absorbs about 10 joules/cm$^2$ of UV energy.

21. A UV energy curable tape comprising:
a support layer;
an adhesive material positioned on said support layer, and including a UV energy curable oligomer, a UV energy initiator, and given a material for emitting light;
wherein a defined amount of UV energy is needed to substantially fully cure the tape; and
said same defined amount of UV energy causes the given material to begin to emit light of a given type, whereby said given material provides a visible indication that the tape is substantially fully cured.

22. A UV energy curable tape according to claim 21, wherein:
said given material is a UV sensitive ink and comprises about 0.001% by weight of the tape; and
said given material starts to emit light of the given type when the tape absorbs about 10 joules/cm$^2$ of UV energy.

* * * * *